United States Patent
Wang

(10) Patent No.: US 11,875,181 B2
(45) Date of Patent: Jan. 16, 2024

(54) MANAGEMENT CONTROLLER AND CONTROL METHOD THEREOF

(71) Applicant: Nuvoton Technology Corporation, Hsinchu Science Park (TW)

(72) Inventor: Cheng-Chih Wang, Jhubei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 449 days.

(21) Appl. No.: 17/136,309

(22) Filed: Dec. 29, 2020

(65) Prior Publication Data

US 2022/0100555 A1 Mar. 31, 2022

(30) Foreign Application Priority Data

Sep. 30, 2020 (TW) .................................. 109134074

(51) Int. Cl.
  *G06F 9/48* (2006.01)
  *H03K 21/38* (2006.01)
(52) U.S. Cl.
  CPC ............ *G06F 9/485* (2013.01); *G06F 9/4812* (2013.01); *H03K 21/38* (2013.01)
(58) Field of Classification Search
  CPC ........ G06F 9/4812; G06F 9/485; H03K 21/38
  See application file for complete search history.

(56) References Cited

U.S. PATENT DOCUMENTS

| 6,088,421 | A  | * | 7/2000 | Rao ...................... G06F 11/348 377/16 |
| 6,209,078 | B1 | * | 3/2001 | Chiang ............... G06F 9/30014 712/36 |
| 9,083,347 | B1 | * | 7/2015 | Remla .................... H03K 21/38 |
| 2006/0064015 | A1 | * | 3/2006 | Davies ................ G01S 7/52028 600/447 |
| 2007/0194822 | A1 |   | 8/2007 | Kumata |
| 2012/0030395 | A1 | * | 2/2012 | Boehl ................... G06F 13/362 710/305 |

(Continued)

FOREIGN PATENT DOCUMENTS

| CN | 109240130 A | 1/2019 |
| CN | 109710177 A | 5/2019 |

(Continued)

*Primary Examiner* — Vincent H Tran
(74) *Attorney, Agent, or Firm* — Muncy, Geissler, Olds & Lowe, P.C.

(57) ABSTRACT

A management controller is coupled to a plurality of external devices. The management controller includes a control circuit and a transmission circuit. The control circuit generates a control signal according to a first counting value and a second counting value. The transmission circuit is coupled to the external devices. In response to the first counting value not being equal to a first target value, the transmission circuit enters a circulating mode according to the control signal. In the circulating mode, the transmission circuit triggers the external devices in order. In response to the second counting value not being equal to a second target value, the transmission circuit continues to operate in the circulating mode. In response to the second counting value being equal to the second target value, the transmission circuit exits the circulating mode.

20 Claims, 5 Drawing Sheets

(56) References Cited

U.S. PATENT DOCUMENTS

| | | | | |
|---|---|---|---|---|
| 2014/0075052 A1* | 3/2014 | Kris | ......................... | G06F 3/05 |
| | | | | 710/5 |
| 2014/0380338 A1* | 12/2014 | Makovsky | ............ | G06F 1/3206 |
| | | | | 719/318 |
| 2015/0338866 A1* | 11/2015 | Hu | ......................... | G05F 1/575 |
| | | | | 323/280 |
| 2017/0322807 A1* | 11/2017 | Brabender | .......... | G06F 9/30087 |
| 2018/0020948 A1* | 1/2018 | Butterworth | ......... | A61B 5/0507 |
| | | | | 600/430 |
| 2019/0129768 A1* | 5/2019 | Novogran | ........... | G06F 11/3037 |
| 2020/0371800 A1* | 11/2020 | Chirca | .................... | G06F 9/325 |
| 2021/0286545 A1* | 9/2021 | Pasquale | ............... | G06F 3/0604 |

FOREIGN PATENT DOCUMENTS

| | | | |
|---|---|---|---|
| CN | 110286707 A | 9/2019 | |
| CN | 111432092 A | 7/2020 | |
| TW | 201113708 A | 4/2011 | |
| TW | I604309 B | 11/2017 | |

\* cited by examiner

MANAGEMENT CONTROLLER AND CONTROL METHOD THEREOF

CROSS REFERENCE TO RELATED APPLICATIONS

This Application claims priority of Taiwan Patent Application No. 109134074, filed on Sep. 30, 2020, the entirety of which is incorporated by reference herein.

BACKGROUND OF THE INVENTION

Field of the Invention

The invention relates to a management controller, and more particularly to a management controller that triggers external devices based on the order in which certain events occur.

Description of the Related Art

With technological development, the types and functions of electronic devices have increased. Generally, each electronic device has many electronic elements. Each element usually operates according to an external trigger signal. A conventional method of controlling many elements is to utilize a program code to activate many elements at the appropriate points in time.

BRIEF SUMMARY OF THE INVENTION

In accordance with an embodiment of the disclosure, a management controller is coupled to a plurality of external devices and comprises a first counter, a second counter, a control circuit, and a transmission circuit. The first counter is configured to provide a first counting value. The second counter is configured to provide a second counting value. The control circuit generates a control signal according to the first counting value and the second counting value. The transmission circuit is coupled to the external devices. In response to the first counting value not being equal to a first target value, the transmission circuit enters a circulating mode according to the control signal. In the circulating mode, the transmission circuit triggers the external devices in order. In response to the second counting value not being equal to a second target value, the transmission circuit continues to operate in the circulating mode. In response to the second counting value being equal to the second target value, the transmission circuit exits the circulating mode.

A control method for a management controller coupled to a plurality of external devices is provided. An exemplary embodiment of a control method for a management controller is described in the following paragraph. A first counting value and a second counting value are set. In response to an event occurring and the first counting value not being equal to a first target value, one matrix among a plurality of matrices is selected according to the second counting value. The selected matrix is utilized to send a first trigger signal to a first device of the external devices. The second counting value is adjusted. In response to the second counting value not being equal to the second target value, another matrix among the matrices is selected according to the second counting value, and the selected matrix is utilized to send a second trigger signal to a second device of the external devices until the second counting value is equal to the second target value. In response to the second counting value being equal to the second target value, the first counting value is adjusted. In response to the first counting value being equal to the first target value, no trigger signal is provided to the external devices.

The control method may be practiced by the s management controller which have hardware or firmware capable of performing particular functions and may take the form of program code embodied in a tangible media. When the program code is loaded into and executed by an electronic device, a processor, a computer or a machine, the electronic device, the processor, the computer or the machine becomes an apparatus for practicing the disclosed method.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
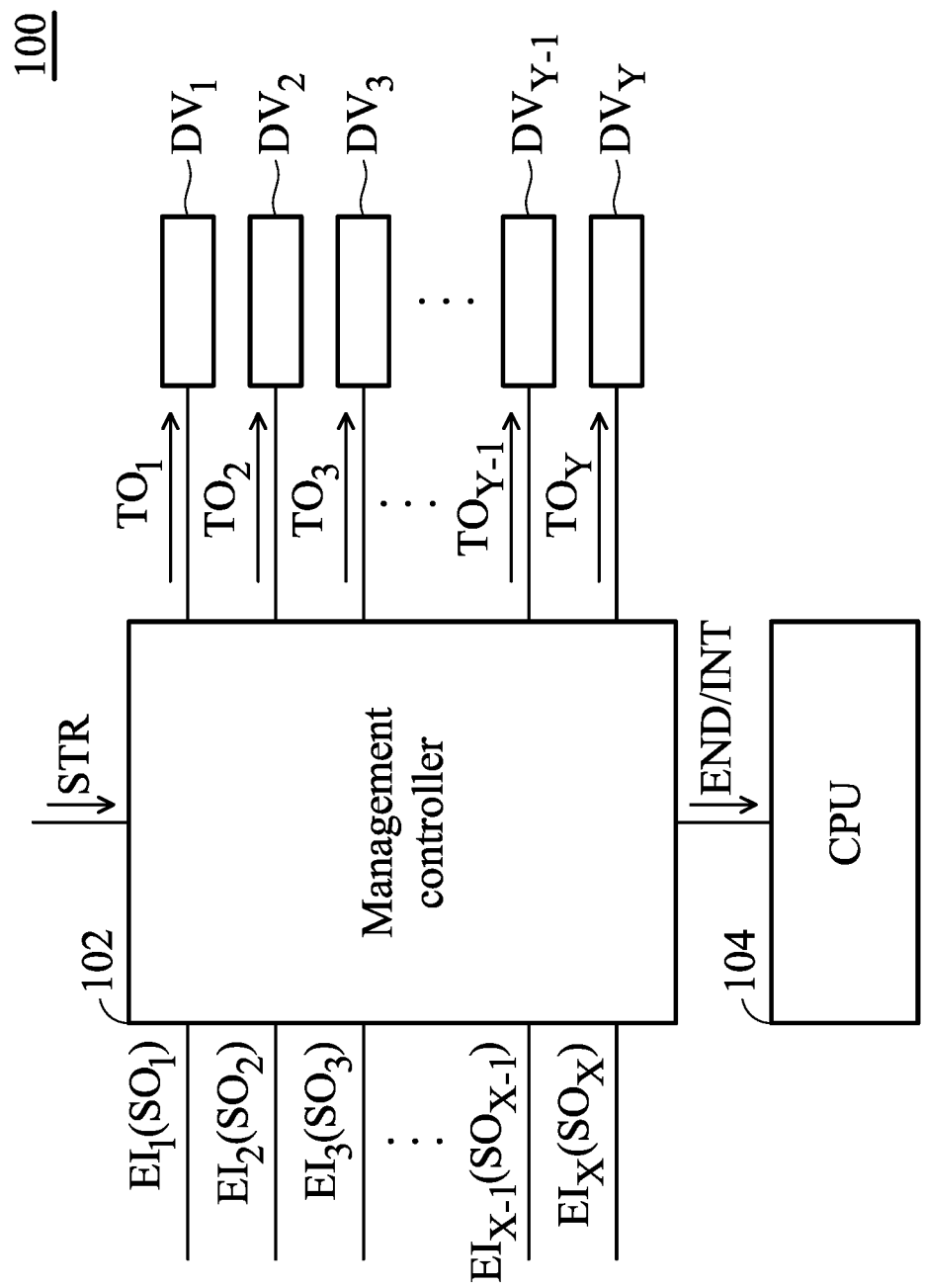
FIG. 1 is a schematic diagram of an exemplary embodiment of an operation system according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operation system according to various aspects of the present disclosure. As shown in FIG. 1, the operation system 100 comprises a management controller 102, a central processing unit (CPU) 104, and external devices $DV_1 \sim DV_Y$. In one embodiment, the operation system 100 is a microcontroller unit (MCU). In this case, the management controller 102, the CPU 104, and the external devices $DV_1 \sim DV_Y$ are integrated into the same chip.

The management controller 102 receives events $EI_1 \sim EI_X$ and generates trigger signals $TO_1 \sim TO_Y$ to trigger the external devices $DV_1 \sim DV_Y$. In this embodiment, the management controller 102 performs a trigger procedure many times. Each when the management controller 102 performs the trigger procedure, the management controller 102 follows the order in which the events $EI_1 \sim EI_X$ occur to trigger the corresponding external devices. For example, when the events $EI_2$, $EI_{X-1}$, $EI_3$, and $EI_X$ occur in order, the management controller 102 successively enables the corresponding trigger signals (e.g., $TO_1$, $TO_3$, $TO_Y$, and $TO_{Y-1}$) to trigger the corresponding external devices (e.g., $DV_1$, $DV_3$, $DV_Y$, and $DV_{Y-1}$) that correspond to the events $EI_2$, $EI_{X-1}$, $EI_3$, and $EI_X$, respectively.

The corresponding relationship between the events $EI_1 \sim EI_X$ and the external devices $DV_1 \sim DV_Y$ is not limited in the present disclosure. In one embodiment, when one of the events $EI_1 \sim EI_X$ occurs, the management controller 102 triggers one of the external devices $DV_1 \sim DV_Y$. In another embodiment, a single event may correspond to many external devices. In such cases, when one of the events $EI_1 \sim EI_X$ occurs, the management controller 102 triggers at least two devices of the external devices $DV_1 \sim DV_Y$. In other embodiment, when one of the events $EI_1 \sim EI_X$ occurs, another of the events $EI_1 \sim EI_X$ also occurs. For example, the events $EI_1$ and $EI_X$ are the same event. In this case, when the event $EI_1$ occurs, since the event $EI_X$ also occurs, the management controller 102 may simultaneously enable at least two of the external devices $DV_1 \sim DV_Y$.

In some embodiments, when one of the external devices $DV_1 \sim DV_Y$ is triggered, the triggered external device performs a specific operation. The specific operation relates to the kind of triggered external device. For example, when the triggered external device is a timer, the triggered external device performs a counting operation. When the trigger external device is an analog-to-digital converter (ADC), the triggered external device performs a transformation operation to transform an analog signal into a digital signal. In some embodiments, the kind of at least one of the external devices $DV_1 \sim DV_Y$ is the same as the kind of another of the external devices $DV_1 \sim DV_Y$. For example, the external devices $DV_1 \sim DV_Y$ comprise a first ADC and a second ADC. In such cases, the analog signal received by the first ADC is different from the analog signal received by the second ADC. In another embodiment, the resolution of the first ADC is different from the resolution of the second ADC.

In one embodiment, the events $EI_1 \sim EI_X$ correspond to the output signals $SO_1 \sim SO_X$, respectively. Taking the event $EI_1$ as an example, when the output signal $SO_1$ is not enabled, it means that there is not the event $EI_1$. However, when the output signal $SO_1$ is enabled, it means the occurrence of the event $EI_1$. Therefore, the management controller 102 enables a corresponding trigger signal to trigger a corresponding external device. In such cases, the management controller 102 is referred to as an event-to-trigger management controller.

The sources providing the output signals $SO_1 \sim SO_X$ are not limited in the present disclosure. In one embodiment, at least one of the output signals $SO_1 \sim SO_X$ is generated by one of the external devices $DV_1 \sim DV_Y$. For example, when one of the external devices $DV_1 \sim DV_Y$ is triggered, the triggered external device performs a specific operation. After finishing the specific operation, the triggered external device may enable a finish signal (not shown). In such cases, the finish signal generated by the triggered external device is provided as one of the output signals $SO_1 \sim SO_X$. In other embodiments, at least one of the output signals $SO_1 \sim SO_X$ is generated by other device which is different from the external devices $DV_1 \sim DV_Y$.

In some embodiments, the management controller 102 further receives a start signal STR. When the start signal STR is enabled, the management controller 102 enters a circulating mode. In the circulating mode, the management controller 102 triggers the corresponding external devices in the order which the events $EI_1 \sim EI_X$ occur in. In one embodiment, when the level of one output signal (e.g., $SO_1$) of the output signals $SO_1 \sim SO_X$ is equal to a specific level (e.g., a high level), it means that an event (e.g., $EI_1$) occurs. Therefore, the management controller 102 triggers the corresponding external device. In one embodiment, the start signal STR serves as one of the output signals $SO_1 \sim SO_X$. In other embodiments, when a specific device of the external devices $DV_1 \sim DV_Y$ is triggered, the management controller 102 exists the circulating mode. The present disclosure does not limit when the management controller 102 exits the circulating mode. In another embodiment, when the start signal STR is not enabled, the management controller 102 exits the circulating mode.

In other embodiments, when the number of times the management controller 102 performs the trigger procedure arrives a target value, the management controller 102 sends an end request END to notify the CPU 104. In this case, the CPU 104 may perform a first specific operation according to the end request END. The first specific operation may read the output signal generated from one of the external devices $DV_1 \sim DV_Y$. In another embodiment, when the number of times the management controller 102 performs the trigger procedure arrives the target value, the management controller 102 enables an end request INT. In this case, the CPU 104 performs a second specific operation according to the end request INT. The second specific operation may read the output signal generated from another of the external devices $DV_1 \sim DV_Y$.

In some embodiments, when the CPU 104 receives the end request END or INT, it means that the management controller 102 has left the circulating mode. Therefore, the CPU 104 performs a corresponding operation according to a software. At this time, the management controller 102 stops operating. In one embodiment, when the start signal STR is enabled, the management controller 102 enters the circulating mode again. In other embodiments, the start signal STR is enabled by the CPU 104. In such cases, during performing the software, the CPU 104 may enable the start signal STR. Therefore, the management controller 102 is started by the software. After starting the management controller 102, if the CPU 104 does not receive the end request END or INT, the CPU 104 does not disturb the operation of the management controller 102. The software may be stored in a memory (not shown). The memory may integrated into the CPU 104 or disposed outside of the CPU 104.

In this embodiment, the management controller 102 provides paths between the events $EI_1 \sim EI_X$ and the external devices $DV_1 \sim DV_Y$. When a first event among the events $EI_1 \sim EI_X$ occurs, a first external device is triggered to perform a first specific operation. After finishing the first specific operation, the first external device enables a finish signal to indicate that a second event of the events $EI_1 \sim EI_X$ occurs. Therefore, a second external device is triggered. After the second external device finishes a second specific operation, the second external device enables a finish signal to indicate that a third event of the events $EI_1 \sim EI_X$ occurs. Therefore, a third external device is triggered until there is no occurrence of event.

The order which events occur in is related to the order which the devices are triggered in. When one of the external devices $DV_1 \sim DV_Y$ is triggered and the triggered external device finishes a specific operation, it means that an event occur. The occurrence of the event triggers another of the external devices $DV_1 \sim DV_Y$. Therefore, when a single event occur after a start time, many external devices are triggered in order. The operation system 100 achieves the function of automatically managing multiple external devices and the efficiency of the operation system 100 is increased.

Figure 2:
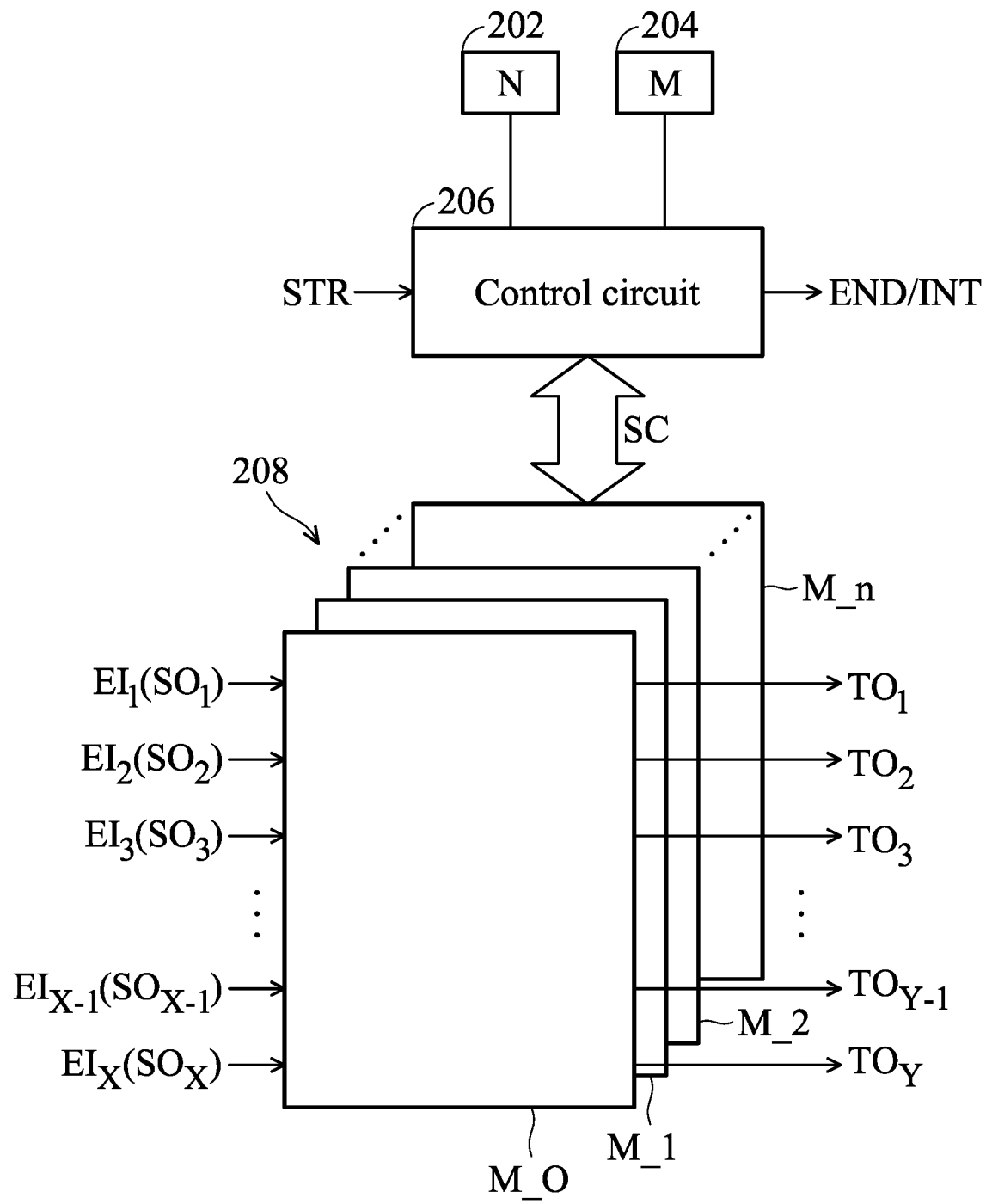
FIG. 2 is a schematic diagram of an exemplary embodiment of a management controller according to various aspects of the present disclosure.

FIG. 2 is a schematic diagram of an exemplary embodiment of a management controller according to various aspects of the present disclosure. The management controller 200 comprises counters 202 and 204, a control circuit 206 and a transmission circuit 208. The counter 202 provides a counting value N. The kind of counter 202 is not limited in the present disclosure. In one embodiment, the counter 202 is a count-up counter. The counter 204 provides a counting value M. The kind of counter 204 is not limited in the present disclosure. In one embodiment, the counter 204 is a down-counter.

The control circuit 206 generates a control signal SC according to the counting value N and the counting value M. For example, when the counting value M is not equal to a first target value, the control circuit 206 enters a circulating mode. In the circulating mode, the control circuit 206 utilizes the control signal SC to direct the transmission circuit 208 to perform a trigger procedure. When performing the trigger procedure, the transmission circuit 208 enables the corresponding external devices according to the order which the events $EI_1$~$EI_X$ occur in. In the circulating mode, the control circuit 206 obtains which stage of the trigger procedure the transmission circuit 208 is in according to the counting value N. When the counting value N is equal to a second target value, the control circuit 206 exists the circulating mode. At this time, the transmission circuit 208 stops triggering any external device.

In one embodiment, the control circuit 206 further receives the start signal STR. In such cases, when the start signal STR is enabled, the control circuit 206 may direct the counter 202 to reset the counting value N. At this time, the counting value N is equal to an initial value, such as 0. Additionally, when the start signal STR is enabled, the control circuit 206 may direct the counter 204 to set the counting value M so that it is equal to a predetermined value, such as 5.

The transmission circuit 208 generates the trigger signals $TO_1$~$TO_Y$ to the external devices $DV_1$~$DV_Y$. The transmission circuit 208 performs a trigger procedure according to the control signal SC so that the corresponding external devices are triggered in the order which certain events occur in. When the counting value M is not equal to a first target value, the control circuit 206 generates the control signal SC. At this time, the transmission circuit 208 enters a circulating mode according to the control signal SC. In this circulating mode, the transmission circuit 208 triggers the trigger signals $TO_1$~$TO_Y$ in order according to the order in which the events $EI_1$~$EI_X$ occur. Each when the transmission circuit 208 enables a trigger signal, the counter 202 adjusts the counting value N. When the counting value N is equal to a second target value, the control circuit 206 determines whether the counting value M is equal to the first target value. When the counting value M is not equal to the first target value, the control circuit 206 directs the transmission circuit 208 to enter the circulating mode again. At this time, the transmission circuit 208 triggers the corresponding external devices in the order which the events $EI_1$~$EI_X$ occur in.

The present disclosure does not limit how the counter 202 obtains whether a trigger signal has been enabled by the transmission circuit 208. In one embodiment, each when the transmission circuit 208 enables a trigger signal, the transmission circuit 208 notifies the counter 202. In another embodiment, the control circuit 206 obtains whether a trigger signal has been enabled by the transmission circuit 208 according to the levels of the trigger signals $TO_1$~$TO_Y$.

In this case, each when a trigger signal has been enabled by the transmission circuit 208, the control circuit 206 notifies the counter 202.

In other embodiments, each when the counting value N is equal to the second target value, the transmission circuit 208 exits the circulating mode. At this time, the counter 202 resets the counting value N such that the counting value N is equal to an initial value. Additionally, the counter 204 adjusts, for example to reduces, the counting value M. In such cases, the control circuit 206 determines whether the counting value M is equal to the first target value. When the counting value M is not equal to the first target value, the control circuit 206 generates the control signal SC to the transmission circuit 208 again. Therefore, the transmission circuit 208 enters the circulating mode again.

In some embodiments, when the counting value M is equal to the first target value, the control circuit 206 may send an end request END or an interrupt request INT. At this time, the control circuit 206 may direct the transmission circuit 208 to leave the circulating mode. Therefore, the transmission circuit 208 stops enabling the trigger signals $TO_1$~$TO_Y$. In other embodiments, when the control circuit 206 sends the end request END or INT, the control circuit 206 stops generating the control signal SC.

In this embodiment, the transmission circuit 208 comprises matrices M_0~M_n. Each of the matrices M_0~M_n comprises a plurality of paths (not shown). Each of the paths provides one of the output signals $SO_1$~$SO_X$ as one of the trigger signals $TO_1$~$TO_Y$. In the circulating mode, the transmission circuit 208 selects a corresponding matrix according to the features (e.g., voltage level or frequency) of the control signal SC.

For example, when the counting value N is equal to a first value, the control circuit 206 sets the level of the control signal SC to a first level. Therefore, the transmission circuit 208 selects the matrix M_0 according to the control signal SC. When the counting value N is equal to a second value, the control circuit 206 sets the level of the control signal SC at a second level. Therefore, the transmission circuit 208 selects the matrix M_1. Since the matrices M_0~M_n are utilized to trigger the corresponding external devices according to the occurrences of the events each of the matrices M_0~M_n may be referred to as an event-to-trigger matrix.

Figure 3:
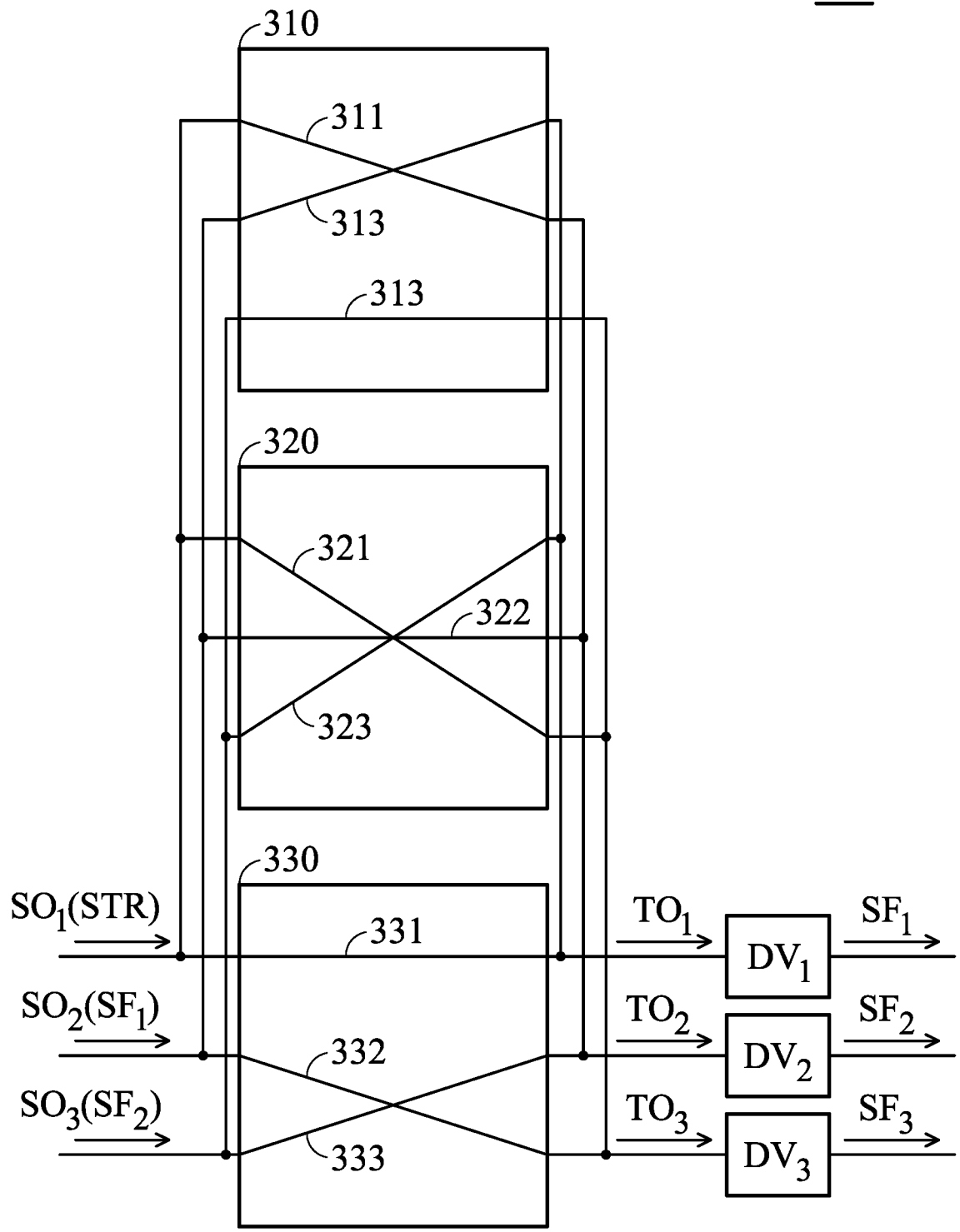
FIG. 3 is a schematic diagram of an exemplary embodiment of a transmission circuit according to various aspects of the present disclosure

FIG. 3 is a schematic diagram of an exemplary embodiment of a transmission circuit according to various aspects of the present disclosure. For brevity, the transmission circuit 300 shown in FIG. 3 comprises the matrices 310, 320, and 330, but the disclosure is not limited thereto. In other embodiments, the transmission circuit 300 comprises more or fewer matrices. As shown in FIG. 3, the matrix 310 comprises paths 311~313. The path 311 is configured to provide the output signal $SO_1$ as the trigger signal $TO_2$. In one embodiment, the output signal $SO_1$ is the start signal STR.

The path 312 is configured to provide the output signal $SO_2$ as the trigger signal $TO_1$. When the trigger signal $TO_1$ is enabled, the external device $DV_1$ is triggered to perform a first specific operation. After finishing the first specific operation, the external device $DV_1$ enables a finish signal $SF_1$. In this case, the finish signal $SF_1$ serves as the output signal $SO_2$.

The path 313 is configured to provide the output signal $SO_3$ as the trigger signal $TO_3$. In one embodiment, the output signal $SO_3$ is served as a finish signal $SF_2$. In this case, when the trigger signal $TO_2$ is enabled, the external device $DV_2$ is triggered to perform a second specific operation. After finishing the second specific operation, the external device $DV_2$ enables the finish signal $SF_2$. Similarly, when the trigger signal $TO_3$ is enabled, the external device $DV_3$ is triggered to perform a third specific operation. After finishing the third specific operation, the external device $DV_3$ enables a finish signal $SF_3$.

The matrix 320 comprises paths 321~323. The path 321 is configured to provide the output signal $SO_1$ as the trigger signal $TO_3$. The path 322 is configured to provide the output signal $SO_2$ as the trigger signal $TO_2$. The path 323 is configured to provide the output signal $SO_3$ as the trigger signal $TO_1$. The matrix 330 comprises paths 331~333. The path 331 is configured to provide the output signal $SO_1$ as the trigger signal $TO_1$. The path 332 is configured to provide the output signal $SO_2$ as the trigger signal $TO_3$. The path 333 is configured to provide the output signal $SO_3$ as the trigger signal $TO_2$.

In one embodiment, when the control signal SC has a first characteristic (e.g., frequency), the transmission circuit 300 selects the matrix 310. At this time, if the start signal STR is enabled, the external device $DV_2$ is triggered. After the external device $DV_2$ finishes a second specific operation, the external device $DV_1$ enables the finish signal $SF_2$. At this time, the control circuit 206 generates the control signal SC which has a second characteristic. Therefore, the transmission circuit 300 selects the matrix 320. Since the finish signal $SF_2$ is enabled, the external device $DV_1$ is triggered to perform a first specific operation. After the external device $DV_1$ finishes the first specific operation, the external device $DV_1$ enables the finish signal $SF_1$. At this time, the control circuit 206 generates the control signal SC which has a third characteristic. Therefore, the transmission circuit 300 selects the matrix 330. Since the finish signal $SF_1$ is enabled, the external device $DV_3$ is triggered to perform a third specific operation. After the external device $DV_3$ finishes the third specific operation, the external device $DV_3$ enables the finish signal $SF_3$.

In this embodiment, the order which the external devices $DV_1$~$DV_3$ are triggered in depends on the order which the output signals $SO_1$~$SO_3$ are enabled in. In this case, when the start signal STR is enabled, the transmission circuit 300 triggers many corresponding external devices according to the order which the output signals $SO_1$~$SO_3$ are enabled in. In other embodiments, when the finish signal $SF_3$ is enabled, it means that the transmission circuit 300 has finished the trigger procedure. Therefore, the control circuit 206 determines whether to direct the transmission circuit 300 to perform the trigger procedure again according to the counting value M.

Figure 4:
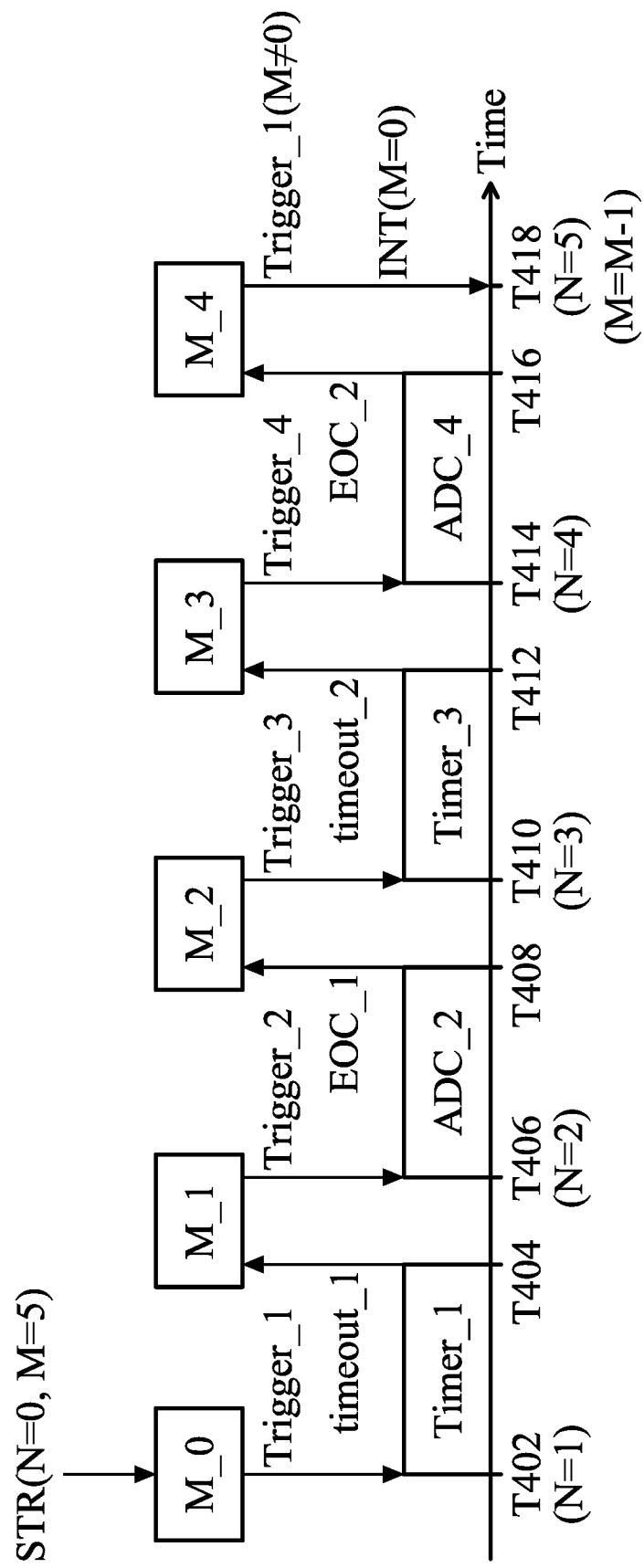
FIG. 4 is a control schematic diagram of an exemplary embodiment of the management controller according to various aspects of the present disclosure

FIG. 4 is a control schematic diagram of an exemplary embodiment of the management controller according to various aspects of the present disclosure. Refer to FIG. 2, when the start signal STR is enabled, the counter 202 sets the counting value N so that it is equal to 0, and the counter 204 sets the counting value M so that it is equal to 5. At this time, since the counting value M is not equal to a first target value (e.g., 0), the control circuit 206 directs the transmission circuit 208 to select the matrix M_0 according to the counting value N.

In the time point T402, the matrix M_0 provides the input signal Trigger_1 to an external device (e.g., a timer Timer_1). In one embodiment, the matrix M_0 serves the start signal STR as the input signal Trigger_1. Since the start signal STR is enabled (i.e., the input signal Trigger_1 is enabled), the timer Timer_1 is triggered. At this time, the counter 202 sets the counting value N so that it is equal to 1. In some embodiments, the input signal Trigger_1 is one of the output signals $SO_1$~$SO_X$ of FIG. 2, and the timer Timer_1 is one of the external devices $DV_1$~$DV_Y$.

In the time point T404, the timer Timer_1 finishes a timekeeping operation. Therefore, the timer Timer_1 enables an output signal timeout_1. In one embodiment, the output signal timeout_1 is one of the output signals $SO_1$~$SO_X$ shown in FIG. 2. At this time, the control circuit 206 directs the transmission circuit 208 to select the matrix M_1 according to the counting value N.

In the time point T406, the matrix M_1 serves the output signal timeout_1 as the input signal Trigger_2. The matrix M_1 provides the input signal Trigger_2 to another external device, such as the analog-to-digital converter ADC_2. Since the input signal Trigger_2 is enabled, the analog-to-digital converter ADC_2 is triggered. At this time, the counter 202 sets the counting value N so that it is equal to 2. In one embodiment, the input signal Trigger_2 is one of the output signals $SO_1$~$SO_X$, and the analog-to-digital converter ADC_2 is one of the external devices $DV_1$~$DV_Y$.

In the timer point T408, the analog-to-digital converter ADC_2 finishes the transform operation. Therefore, the analog-to-digital converter ADC_2 enables an output signal EOC_1. In one embodiment, the output signal EOC_1 is one of the output signals $SO_1$~$SO_X$. At this time, the control circuit 206 directs the transmission circuit 208 to select the matrix M_2 according to the counting value N. The matrix M_2 serves the output signal EOC_1 as an input signal Trigger_3.

In the time point T410, the matrix M_2 provides the input signal Trigger_3 to an external device (e.g., a timer Timer_13. In such cases, since the input signal Trigger_3 is enabled, the timer Timer_3 is triggered. At this time, the counter 202 sets the counting value N so that it is equal to 3. In one embodiment, the input signal Trigger_3 is one of the output signals $SO_1$~$SO_X$ of FIG. 2, and the timer Timer_3 is one of the external devices $DV_1$~$DV_Y$.

In the time point T412, the timer Timer_3 finishes a timekeeping operation. Therefore, the timer Timer_3 enables an output signal timeout_2. The control circuit 206 directs the transmission circuit 208 to select the matrix M_3 according to the counting value N.

In the time point T414, the matrix M_3 serves the output signal timeout_2 as an input signal Trigger_4 and provides the input signal Trigger_4 to another external device, such as the analog-to-digital converter ADC_4. Since the input signal Trigger_4 is enabled, the analog-to-digital converter ADC_4 is triggered. At this time, the counter 202 sets the counting value N so that it is equal to 4.

In the timer point T416, the analog-to-digital converter ADC_4 finishes a transform operation. Therefore, the analog-to-digital converter ADC_4 enables an output signal EOC_2. In one embodiment, the output signal EOC_2 is one of the output signals $SO_1$~$SO_X$. At this time, the control circuit 206 directs the transmission circuit 208 to select the matrix M_4 according to the counting value N.

In the time point T418, since the counting value N is equal to 5 (i.e., the second target value), the counter 204 adjusts the counting value M, such as from 5 to 4. At this time, the counter 202 resets the counting value N such that the counting value N is equal to 0. The control circuit 206 determines whether the counting value M is equal to the first target value (e.g., 0). When the counting value M is not equal to the first target value, the matrix M_4 serves the output signal EOC_2 as the input signal Trigger_1 and provides the input signal Trigger_1 to the timer Timer_1. However, when the counting value M is equal to the first target value, the matrix M_4 serves the output signal EOC_2 as an interrupt request INT.

In this embodiment, the trigger procedure is to successively trigger the timer Timer_1, the analog-to-digital converter ADC_2, the timer Timer_3 and the analog-to-digital converter ADC_4. Therefore, the trigger procedure is explained to activate the analog-to-digital converter ADC_2 after a first predetermined time (e.g., 3 sec), and activates the analog-to-digital converter ADC_4 after a second predetermined time (e.g., 10 sec). In one embodiment, the counting value N indicates which external device is triggered in the trigger procedure. For example, when the counting value N is equal to 1, it means that the timer Timer_1 is triggered.

Additionally, the counting value M indicates the number of times the trigger procedure is performed. Assume that the counting value M is equal to 2. In such cases, the order which the external devices are trigger in is the timer Timer_1, the analog-to-digital converter ADC_2, the timer Timer_3, the analog-to-digital converter ADC_4, the timer Timer_1, the analog-to-digital converter ADC_2, the timer Timer_3, and the analog-to-digital converter ADC_4. Since each external device corresponds to an event, when a specific event occurs, many external devices are trigger in a predetermined order. There is no addition processor or software to trigger many external devices.

Figure 5:
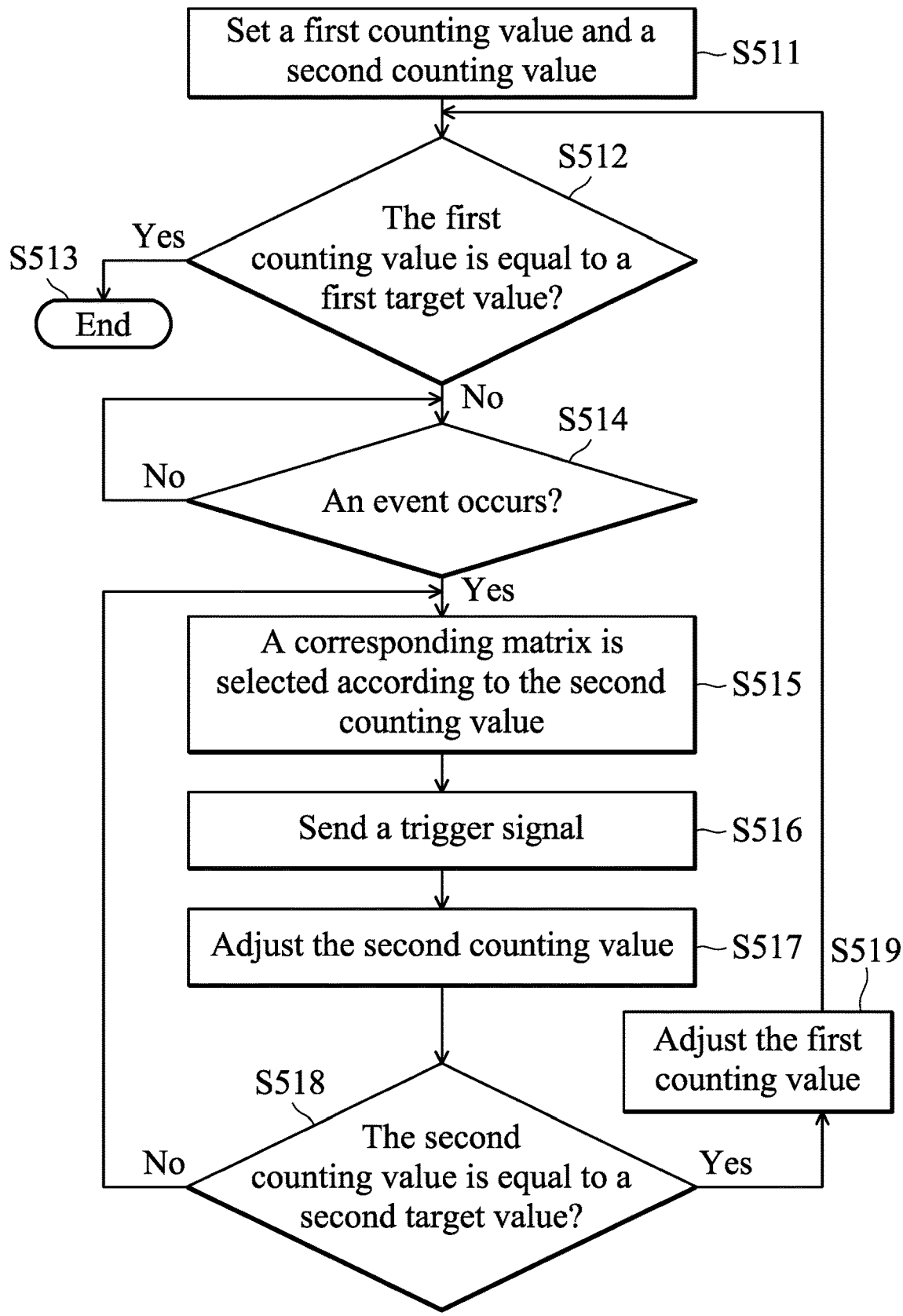
FIG. 5 is a flowchart of an exemplary embodiment of a control method according to various aspects of the present disclosure.

FIG. 5 is a flowchart of an exemplary embodiment of a control method according to various aspects of the present disclosure. The control method is applied in a management controller to direct the management controller automatically perform a trigger procedure many times. Each when the management controller performs the trigger procedure, the management controller triggers the corresponding external devices according to the order in which certain events occur.

First, a first counting value and a second counting value are set (step S511). In one embodiment, the first counting value is set to a predetermined value, and the second counting value is set to an initial value. In some embodiments, the first counting value is provided by a first counter, and the second counting value is provided by a second counter. The first counter may be a countdown counter, and the second counter may be a up counter. In other embodiments, before performing step S511, a determination is first made as to whether a start signal is enabled. When the start signal is not enabled, step S511 does not be performed. When the start signal is enabled, step S511 sets the first counting value to a predetermined value and sets the second counting value to an initial value.

A determination is made as to whether the first counting value is equal to a first target value (step S512). When the first counting value is equal to the first target value (e.g., 0), the operation ends (step S513). When the first counting value is not equal to the first target value, a determination is made as to whether an event occurs (step S514). In one embodiment, when an output signal is enabled, it means that an event occurs.

When there is no event, step S514 is performed. When an event occurs, a corresponding matrix among many matrices is selected according to the second counting value (step S515). For example, when the second counting value is equal to a first value, a first matrix among many matrices is selected. When the second counting value is equal to a second value, a second matrix among many matrices is selected.

A trigger signal is provided to an external device (step S516). In this embodiment, each matrix has many paths. In such cases, each path serves one output signal as a trigger signal and provides the trigger signal to an external device. When the output signal is enabled, the corresponding external device is triggered. In one embodiment, when one external device is triggered, the external device performs a specific operation. After finishing the specific operation, the external device may enable a finish signal. In this case, the enabled finish signal represents the occurrence of one event. Therefore, the enabled finish signal is provided as one output signal.

The second counting value is adjusted (step S517). In this embodiment, step S517 is to increase the second counting value. Next, a determination is made as to whether the second counting value is equal to a second target value (step S518). When the second counting value is not equal to the second target value, step S515 is performed to select a corresponding matrix according to the second counting value again. When the second counting value is equal to the second target value, the first counting value is adjusted (step S519). In this embodiment, step S519 is to reduce the first counting value. The, a determination is made as to whether the first counting value is equal to the first target value (step S512).

The control method uses the occurrences of the events to trigger the corresponding external devices at different times. Therefore, many external devices are activated in order. No software or processor is utilized to trigger the external devices. The trigger procedure is performed for many external devices in order. Therefore, the function of automatically managing external devices is achieved and the efficiency of the operation system is increased.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes a management controller for practicing the methods. The control methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a management controller for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A management controller coupled to a plurality of external devices and comprising:
   a first counter configured to provide a first counting value;
   a second counter configured to provide a second counting value;
   a control circuit generating a control signal according to the first counting value and the second counting value; and
   a transmission circuit coupled to the external devices, wherein in response to the first counting value not being equal to a first target value, the transmission circuit enters a circulating mode according to the control signal,
   wherein:
   in the circulating mode, the transmission circuit triggers the external devices in order,
   in response to the second counting value not being equal to a second target value, the transmission circuit continues to operate in the circulating mode,
   in response to the second counting value being equal to the second target value, the transmission circuit exits the circulating mode, and
   in response to a first specific device of the external devices finishing a specific operation, the first specific device enables a finish signal and the transmission circuit provides the finish signal to a second specific device of the external devices to trigger the second specific device.

2. The management controller as claimed in claim 1, wherein the second counter adjusts the second counting value each time the transmission circuit triggers one of the external devices.

3. The management controller as claimed in claim 2, wherein in response to the second counting value being equal to the second target value, the first counter adjusts the first counting value and the second counter resets the second counting value.

4. The management controller as claimed in claim 3, wherein the first counter is a down-counter, and the second counter is an up-counter.

5. The management controller as claimed in claim 1, wherein in response to the first counting value being equal to the first target value, the control circuit stops providing the control signal and sends an interrupt request to a central processing unit (CPU).

6. The management controller as claimed in claim 1, wherein in response to a start signal being enabled, the control circuit starts to generate the control signal according to the first counting value and the second counting value.

7. The management controller as claimed in claim 6, wherein the transmission circuit comprises a plurality of matrices, each of the matrices comprises a plurality of paths, each path provides a trigger signal to one of the external devices, and one of the paths transmits the start signal to one of the external devices.

8. The management controller as claimed in claim 7, wherein one of the trigger signals is generated by one of the external devices.

9. The management controller as claimed in claim 7, wherein:
   a first path of the paths transmits the finish signal to the second specific device of the external devices to trigger the second specific device,
   a second path of the paths transmits the finish signal to a third specific device of the external devices, and
   the first path is disposed in a first matrix of the matrices, and the second path is disposed in a second matrix of the matrices.

10. The management controller as claimed in claim 7, wherein the transmission circuit selects one of the matrices according to the control signal.

11. A control method applied in a management controller coupled to a plurality of external devices, comprising:
    setting a first counting value and a second counting value;
    determining whether an event occurs;
    determining whether the first counting value is equal to a first target value;
    selecting a first matrix among a plurality of matrices according to the second counting value in response to the event occurring and the first counting value not being equal to the first target value;
    utilizing the first matrix to send a first trigger signal to a first device of the external devices;
    adjusting the second counting value;
    determining whether the second counting value is equal to a second target value;
    in response to the second counting value not being equal to the second target value:
    selecting a second matrix among the matrices according to the second counting value;
    utilizing the second matrix to send a second trigger signal to a second device of the external devices until the second counting value is equal to the second target value;
    in response to the second counting value being equal to the second target value:
    adjusting the first counting value; and
    determining whether the first counting value is equal to the first target value again; and
    stopping any trigger signal being provided to the external devices in response to the first counting value being equal to the first target value,
    wherein:
    in response to the first device receiving the first trigger signal, the first device performs a specific operation,
    in response to the first device finishing the specific operation, the first device enables a finish signal, and
    the second matrix provides the finish signal as the second trigger signal to trigger the second device.

12. The control method as claimed in claim 11, wherein the second device is the first device.

13. The control method as claimed in claim 11, wherein adjusting the second counting value means to increase the second counting value.

14. The control method as claimed in claim 13, wherein adjusting the first counting value means to reduce the first counting value.

15. The control method as claimed in claim 11, further comprising:
    setting the second counting value so that it is equal to an initial value in response to the second counting value being equal to the second target value.

16. The control method as claimed in claim 11, wherein:
    each time the second counting value is equal to a first value the first matrix of the matrices is selected, and
    each time the second counting value is equal to a second value the second matrix of the matrices is selected.

17. The control method as claimed in claim 11, further comprising:

sending an interrupt request to a central processing unit (CPU) in response to the first counting value being equal to the first target value, wherein the CPU reads one of the external devices according to the interrupt request.

18. The control method as claimed in claim 11, further comprising:

determining whether a start signal has been enabled; and setting the first counting value so that it is equal to a predetermined value and setting the second counting value so that it is equal to an initial value in response to the start signal having been enabled.

19. The control method as claimed in claim 18, wherein the start signal is provided as the first trigger signal.

20. The control method as claimed in claim 19, wherein the second trigger signal is provided by the first device.

* * * * *